(12) United States Patent
Antoni et al.

(10) Patent No.: US 6,655,808 B2
(45) Date of Patent: Dec. 2, 2003

(54) FOCUSING-DEVICE FOR THE RADIATION FROM A LIGHT SOURCE

(75) Inventors: Martin Antoni, Aalen (DE); Frank Melzer, Utzmemmingen (DE); Andreas Seifert, Aalen (DE); Wolfgang Singer, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 29 days.

(21) Appl. No.: 09/950,186

(22) Filed: Sep. 10, 2001

(65) Prior Publication Data

US 2002/0113954 A1 Aug. 22, 2002

(30) Foreign Application Priority Data

Sep. 13, 2000 (DE) .......................................... 100 45 265

(51) Int. Cl.[7] ................................................. G02B 5/08
(52) U.S. Cl. ....................................... 359/846; 359/869
(58) Field of Search ..................... 355/53, 52; 359/631, 359/727, 846, 869; 126/602, 605

(56) References Cited

U.S. PATENT DOCUMENTS

| | | | | |
|---|---|---|---|---|
| 5,594,831 A | * | 1/1997 | Oparin et al. | ................ 392/421 |
| 5,798,823 A | * | 8/1998 | Kudo | ........................... 355/67 |
| 6,381,387 B1 | * | 4/2002 | Wendland, Jr. | ............... 385/37 |

* cited by examiner

*Primary Examiner*—Euncha Cherry
(74) *Attorney, Agent, or Firm*—Welsh & Katz, Ltd.

(57) ABSTRACT

A focusing-device for the radiation from a light source, in particular a laser plasma source, has a collector mirror which collects the light from the light source at a second focus in virtual or real terms, in particular for micro-lithography using EUV radiation, and a routing unit and downstream beam formation in an illuminating system. The collector mirror can be displaced in the z-direction (optical axis) and is designed and/or mounted in such a way that the position of the second focus remains unchanged in the event of temperature changes.

16 Claims, 5 Drawing Sheets

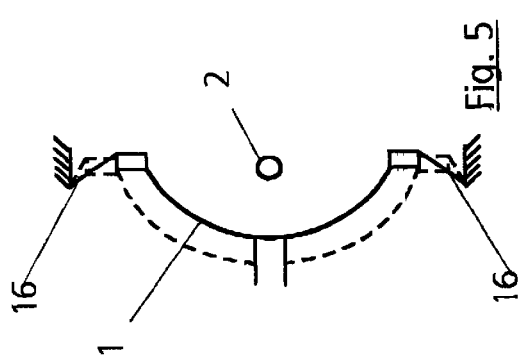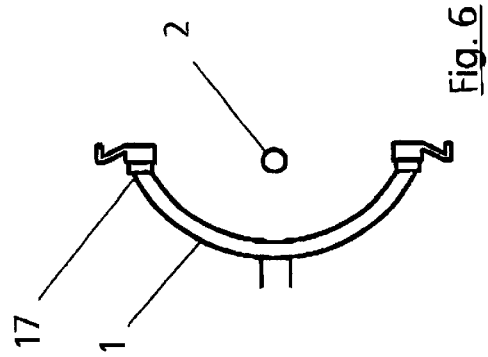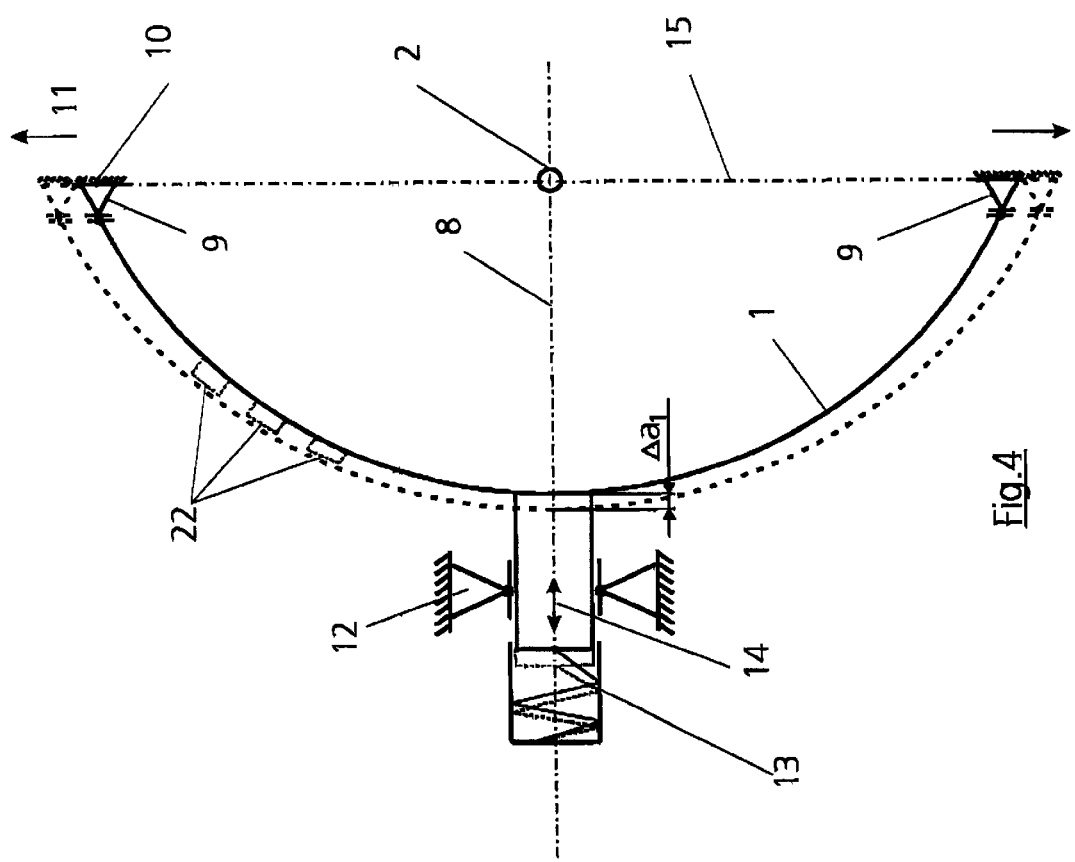

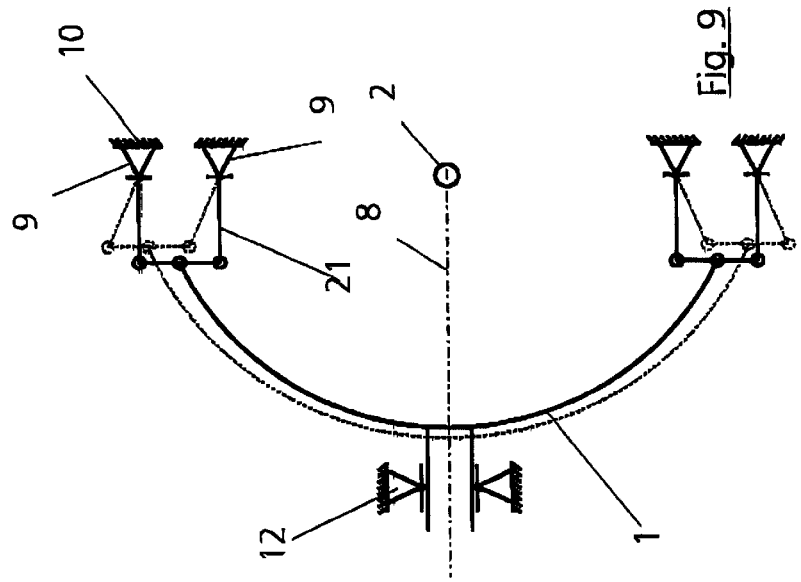
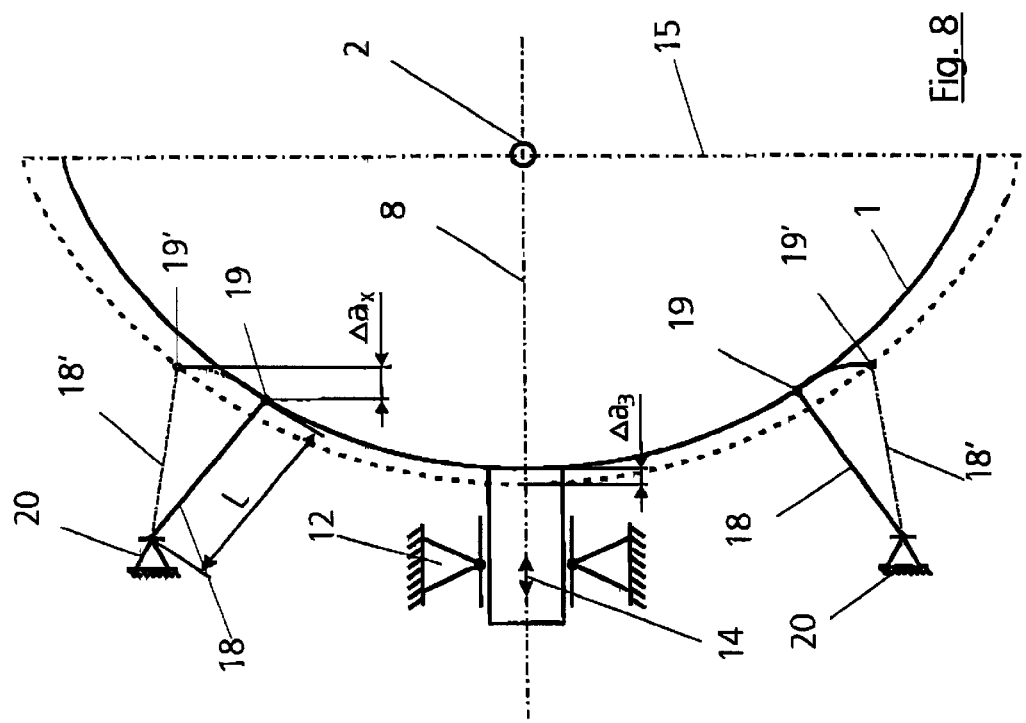

FOCUSING-DEVICE FOR THE RADIATION FROM A LIGHT SOURCE

BACKGROUND OF THE INVENTION

The invention relates to a focusing-device for the radiation from a light source, in particular a laser plasma source, having a collector mirror according to the preamble of claim 1 of a type defined more closely.

In micro-lithography, use is frequently made of a light source, for example a laser plasma source, whose light is collected, in virtual or real terms, via a collector mirror at a second focus, and then guided for beam formation into a illuminating system. The collector mirror is heated by the laser plasma source, resulting in corresponding changes in shape which have negative effects on the downstream illuminating system such as, for example, illumination defects, for example telecentring errors, uniformity defects, and this can lead to light losses.

It is known for the purpose of avoiding these disadvantages to cool the collector mirror in order to dissipate the heat produced. Irrespective of the large outlay required for this purpose, because of unavoidable tolerances problems continue to exist, nevertheless, with reference to the imaging accuracy, and these are to be ascribed, inter alia, to a change in position of the second focus. In addition, given high thermal loads, which can vary strongly with time in the case of pulsed operation, the collector mirror cannot be kept entirely at a constant temperature level, and so would necessitate a "dynamic" cooling system, It is the object of the present invention to create a device in the case of which the disadvantages of the prior art are avoided, in particular in the case of which the optical properties of a collector mirror are maintained in an unchanged form even under thermal loading such that no negative effects on the downstream illuminating system occur.

SUMMARY OF THE INVENTION

According to the invention, this object is achieved by means of the features claimed in claim 1.

By virtue of the fact that the collector mirror is specifically displaced in the z-direction, that is to say in the direction of the optical axis, and that the collector mirror itself is designed in such a way that the position of the second focus remains unchanged in the event of temperature change, the optical properties of the collector mirror are maintained in an unchanged form even under thermal loading.

It is proposed according to the invention in a first design solution to mount or configure the collector mirror such that its shape is formed in accordance with an isofocal family of curves, for example a family of ellipses, a family of hyperbolas or a family of parabolas. What is meant by an "isofocal" family of curves is that the spacing from the source, that is to say from the first focus, to the second focus does not change. Only a family of ellipses will be spoken of below, for the sake of simplification, If an isofocal family of ellipses projects a source into a fixed image of the source. The collector mirror is now shaped under heating in accordance with the isofocal family of ellipses, its optical properties remain constant. This means that it is then no longer necessary to cool the collector mirror, or to keep it at a constant temperature, by means of a high outlay, but that heating is permitted while ensuring, however, that the change in shape of the collector mirror resulting therefrom takes place such that selected optical properties remain unchanged.

For such an isofocal collector mirror, the conic constant K and the semiparameter p=R can be represented to a good approximation by linear functions of the intercept distance between the source and the vertex of the collector mirror.

If, on the other hand, the aim is to avoid a change in magnification, normally negligible per se, owing to a change in or displacement of the collector mirror, the spacing from the source to the imaging plane of the light source must be varied as second solution. This can be performed, for example, actively or else via a passive thermal expansion. The eccentricity Y or conic constant K must remain constant for such a collector mirror which contains magnification, and the vertex curvature p=R must change linearly. This solution is advantageous in some circumstances for a system with critical illumination, because then the image of the light source remains the same size on the reticle.

By contrast with the solution using the isofocal family of curves, the spacing between the first and the second focus remaining the same, in this alternative solution the beam angle from the collector mirror to the second focus remains the same, the second focus thereby being displaced correspondingly. If the second focus is to remain at the same point, it follows that not only the collector mirror must be moved correspondingly in the z-direction, but also the source or the first focus.

Since collector mirrors are generally subjected to an anisotropic thermal loading, it may be provided in a refinement according to the invention that the collector mirror is provided with inhomogenously distributed cooling devices in such a way that an at least approximately uniform temperature distribution is achieved in the collector mirror. Although this does entail a higher outlay, by comparison with known cooling devices, however, this outlay can be kept markedly lower, because there is no need to carry out an entire cooling of the collector mirror, but only to ensure a largely uniform temperature distribution.

BRIEF DESCRIPTION OF THE DRAWINGS

Design configurations for specifically carrying out the change in shape of the collector mirror in the desired way are explained schematically in principle in the subclaims and in the exemplary embodiments described below diagrammatically with the aid of the drawing, in which:

FIG. 4 shows a first type of bearing for the isofocal collector mirror according to the invention;

FIG. 5 shows a bearing of an isofocal collector mirror with a bending spring;

FIG. 6 shows a bearing of an isofocal collector mirror with active components;

FIG. 8 shows a bearing for an isofocal collector mirror with a reduced change in position in the event of temperature increase; and FIG. 9 shows a bearing of an isofocal collector mirror in a mount via a parallelogram guide.

DETAILED DESCRIPTION OF THE PREFERRED EMBODIMENTS

Figure 1:
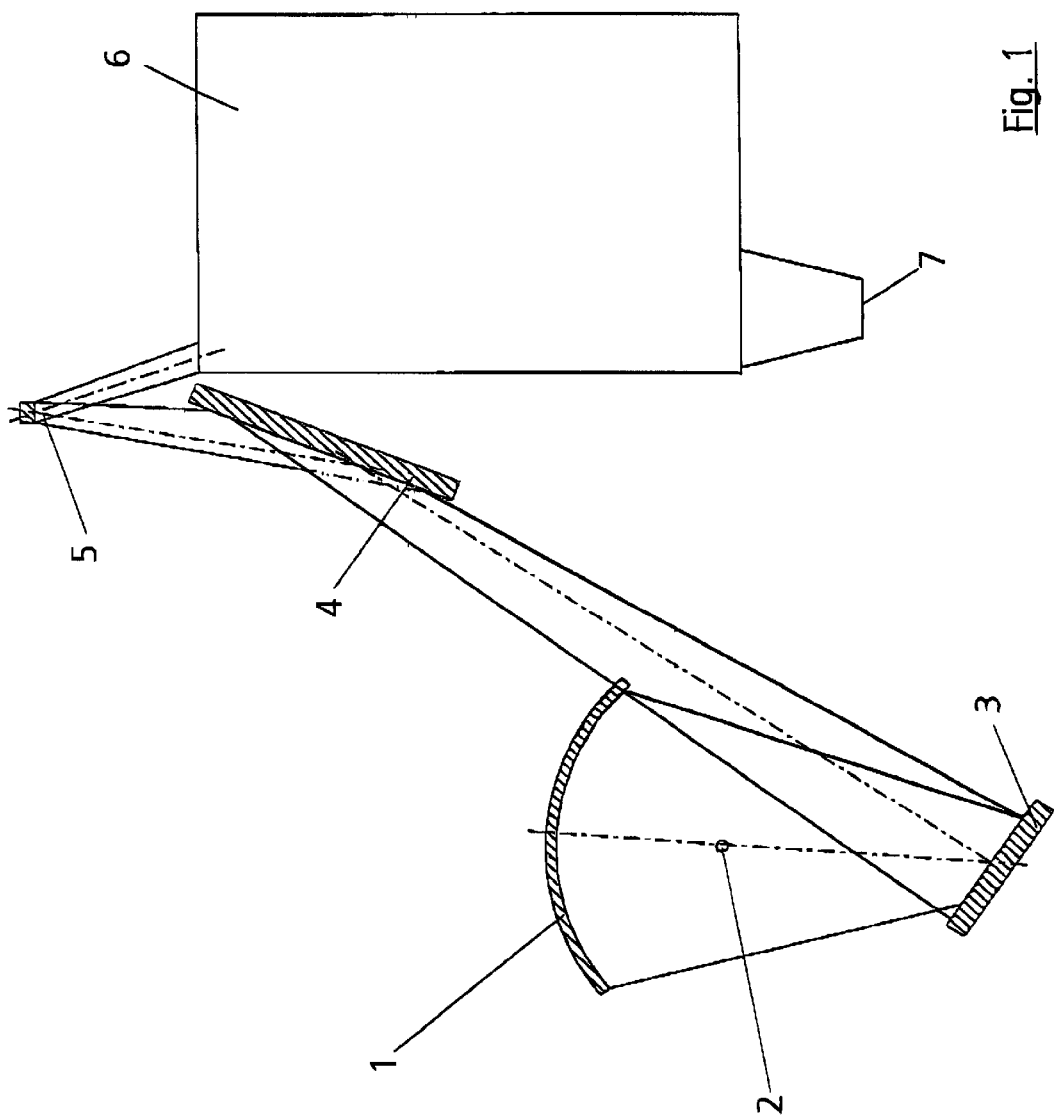
FIG. 1 shows a schematic illustration of a collector mirror according to the invention which is arranged in an EUV illuminating system for micro-lithography.

Illustrated in FIG. 1 as an example for the possibility of using a collector mirror 1 which behaves isofocally is an arrangement of such a mirror in an illuminating system for EUV lithography.

The light from a source 2, for example a laser plasma source or a pinch plasma or dense plasma focus, is projected onto a facet mirror 3 via the collector mirror 1. The source 2 is situated at the first focus of the collector mirror 1. In the exemplary embodiment illustrated, the second focus (not illustrated) is situated downstream of the facet mirror 3. The light is fed to a routing unit and downstream beam formation in an illuminating system from the facet mirror 3 to a reticule (mask) 5 via a deflecting mirror 4. The structure of the reticule 5 is led to a wafer 7 for imaging via a projection lens 6 (not shown in any more detail).

The laser plasma source 2 subjects the collector mirror 1 to a high thermal load which changes its shape. This change in shape would normally lead to uncontrolled illumination defects.

Figure 2:
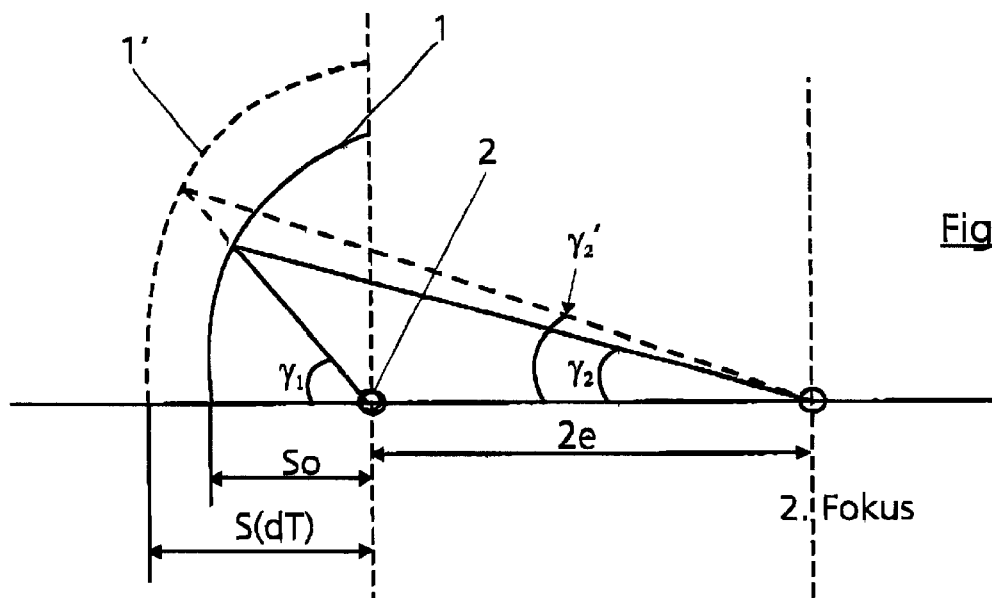
FIG. 2 shows a representation of the principle of the travel path of the radiation between the collector mirror and the second focus, for an isofocal family of ellipses.

FIG. 2 now shows a representation of the principle of a controlled change in shape and displacement of the collector mirror 1 such that the optical properties of the collector mirror are maintained. This illustrates a solution in which the collector mirror 1 is specifically displaced in the z-direction, and its shape is changed in accordance with an isofocal family of curves, in such a way that the second focus remains unchanged with reference to its position.

To a good approximation, the parameters $\epsilon$ and p describing the family of ellipses can be represented as a linear function of the temperature change dT. It therefore holds that:

$$p \approx s_0 \left[ (1+\varepsilon_0) + \alpha \left(1 + \varepsilon_0 - \frac{s_0 \varepsilon_0}{a_0}\right) dT \right]$$

it holds in this case that:
p=semiparameter
2e=focal point spacing
$s_0$=distance from the source to the vertex of the collector mirror
$a_0$=e+$S_0$ and S (dT=0)=$S_0$
It holds for the intercept distance=distance from the source to the collector mirror that:
s=a−e
α=coefficient of linear expansion of the material used, and
ϵ=numerical eccentricity of the ellipse
$\gamma_2$=aperture angle of the radiation between the second focus and the collector mirror.

As may be seen from FIG. 2, the focal point spacing 2e is maintained, and it is only the angle $\gamma_2$ which changes into $\gamma_2'$ and $S_0$ changes into S(dT).

Figure 3:
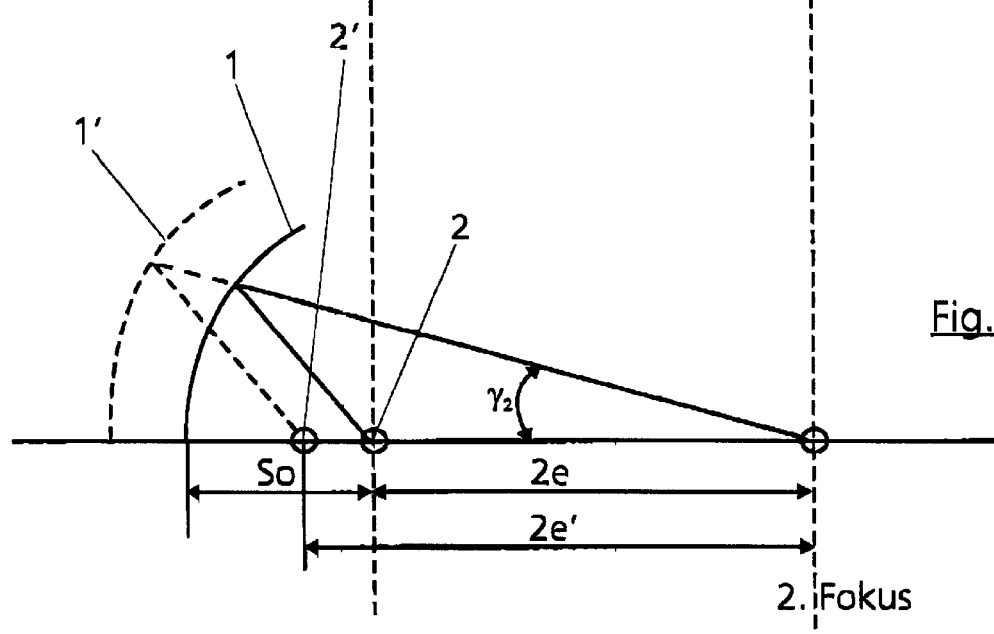
FIG. 3 shows a representation of the principle of the travel path of the radiation between the collector mirror and the second focus, for maintenance of the magnification.

FIG. 3 shows the representation of the principle of a solution, the collector mirror being designed in such a way that the magnification, that is to say the image scale or the aperture on the image side, does not change under thermal loading. The distance from the source 2 to the image of the light source must be varied for this purpose, The eccentricity ϵ or the conic constant K must remain constant for this magnification-maintaining collector, and the vertex curvature p=R must change linearly. It follows from this for the semiparameter p that:

$$p = s \cdot (\epsilon+1) = s_0 \cdot (1+\alpha \cdot dT) \cdot (\epsilon+1) = p_0 \cdot (1+\alpha \cdot dT)$$

where aperture of the source   $P_0$ aperture of the beam   $p_1 = \sin\gamma_2 = \dfrac{\sin\gamma_1}{\beta_0}$ amplification of the collector   $\beta_0 = const.$ As may be seen from FIG. 3, in this case the focal point spacing 2e also changes into 2e', which means that the source 2 displaced toward 2'. As may be seen, the aperture angle $\gamma_2$ is maintained in this case. instead of a displacement of the source 2, it would also be possible in, principle for the second focus to be displaced with the same result, in order to keep the angle $\gamma_2$ the same, In practice, however, the second focus will be kept fixed and the source 2 and collector mirror 1 will be displaced appropriately in the z-direction. Of course, it is also possible to use families of hyperbolas or parabolas instead of families of ellipses.

The collector mirror 1 is designed in accordance with the set requirements such that it behaves when heated in a fashion which a is isofocal or, alternatively, maintains the magnification. This means that a specific change in shape is permitted in such a way that its shape changes accordingly. The most varied design refinements are possible in order to achieve this shaping. The exemplary embodiments described below only diagrammatically with the aid of FIGS. 4 to 9 are therefore to be regarded only by way of example. They relate to an isofocal collector mirror 1. It is true that, given an appropriate design configuration of the collector mirror 1, its suspension and, if appropriate, its cooling, there is likewise a change in the shape of the collector mirror 1, but this is done specifically in such a way that specific desired optical properties remain unchanged, however.

In accordance with the exemplary embodiment according to FIG. 4, the collector mirror 1 is connected at the circumference to a mount 10 via bearings 9 which can be displaced at right angles to the optical axis 8, that is to say to the z-axis (optical axis). Upon heating, the collector mirror 1 expands and the bearings 9 can be displaced—in accordance with the temperature—in the direction of the arrow 11 (see dashed illustration of the collector mirror 1). At the same time, the collector mirror 1 is moved rearward or away from the source 2 in a central guide 12 against the resistance of a spring device 13. As may be seen, this results in a change in spacing $\Delta a_1$ between the source 2 and the vertex. In order to maintain isofocality of the collector mirror, or to keep the latter isothermal with reference to its optical properties, it need only be ensured that the change in spacing $\Delta a_1$ is set in such a way as to result in the desired isofocal family of ellipses with the same optical effects resulting therefrom. The required change in spacing can, however, be determined either computationally or empirically from a knowledge of the materials used, the coefficients of expansion, the focal point spacings and further known parameters.

Under thermal loading, the collector mirror 1 should execute a displacement along the z-axis, that is to say the intercept distance must change. It is also advantageous for this purpose to mount the mirror in the plane 15 of the source 2. In the event of thermal expansion, it then automatically executes a movement against the z-axis 8. The ellipses then differ from one another only in the image scale of the source image or in the "relative aperture" of the aperture "on the image side". Such a change in the image scale is slight, however, and generally has only a negligible influence on the performance of the illuminating system.

If the passive design does not suffice, the z-displacement can be set more accurately by means of suitable materials in the mount or between the mount 10 and the collector mirror 1 or the bearing 9. This can be performed, for example, by means of a suspension via bending elements 16 (see FIG. 5), or else by means of one or more active components 17 (see FIG. 6). The active components 17 can be arranged between the collector mirror 1 and the mount 10. Use may be made as active components of, for example, materials with specific expansion coefficients, in order to achieve the required longitudinal displacement. Also possible likewise, are purely active actuating elements such as, for example, pneumatic, hydraulic, magnetostatic, piezoelectric elements and the like. Such active elements have the advantage that they can be driven specifically and, if required, also with appropriate adaptations and changes.

Figure 7:
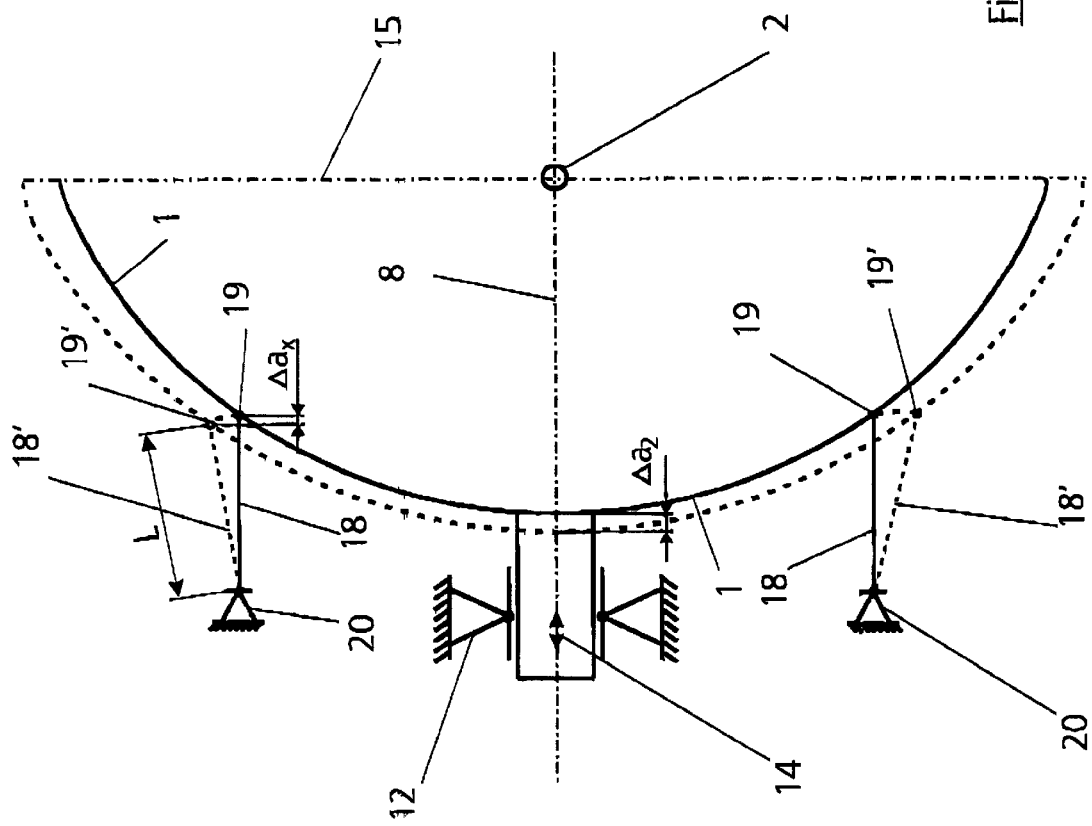
FIG. 7 shows a bearing of an isofocal collector mirror with an additional variation in spacing in the event of temperature increase.

A type of bearing for an isofocal collector mirror 1 is illustrated in FIG. 7, its "natural" displacement $\Delta a_1$ additionally further being amplified. For this purpose, a plurality of struts 18 are arranged from the collector mirror 1 in a fashion distributed over the circumference. They are located in this case in a circumferential region between the z-axis 8 and the outer circumference. The struts 18 are connected at one end to the collector mirror 1 via fulcrum 19 in each case, while the other end is respectively supported in an articulated fashion at a bearing point 20 in each case. The longitudinal axes of the struts 18 extend parallel to the z-axis 8. If the collector mirror 1 now experiences a temperature rise, it expands and reaches the dashed position. At the same time, the struts 18 are also displaced thereby, and their fulcrums are displaced into the dashed positions 18' and 19', as a result of which the distance of the source 2 from the vertex of the collector mirror 1 additionally changes further by the value $\Delta a_x$. The total displacement of the collector mirror 1 is therefore $\Delta a_2 = \Delta a_1 + \Delta a_x$. $\Delta a_z$ can be set as desired via the lengths L of the struts 18 so as to achieve the isofocality.

The outward pivoting of the struts 18 produces a corresponding shortening with reference to the projection onto the z-axis, and thus additional path $\Delta a_x$.

The principle of a refinement is illustrated in FIG. 8, the inverse behavior being achieved. In this case, struts 18 likewise distributed over the circumference are provided, being situated between the z-axis 8 and the outer circumference of the collector mirror 1 and likewise being connected at one end to the collector mirror 1 via an articulation 19 in each case, and being mounted with the other end in a bearing point 20.

The longitudinal axes of the struts 18 are, however, arranged in this case obliquely relative to the z-axis in such a way that given a rearward displacement of the collector mirror 1 the struts 18 counteract this displacement, specifically by a measure $\Delta a_x$, in turn. In this case, it holds that $\Delta a_3 = \Delta a_1 - \Delta a_x$ for the displacement of the collector mirror 1. Here, as well, $\Delta a_x$ can be set via the lengths L of the struts 18, and it is possible thereby to achieve a corresponding total displacement of the collector mirror 1 in such a way as to produce isofocality.

Whether to select the refinement according to FIG. 7 with the increase in the total displacement distance, or in accordance with FIG. 8 with the reduction in the total displacement distance, is determined in each case by the specific conditions of use and parameters.

A type of bearing for the collector mirror 1 is illustrated in principle in FIG. 9, the bearing being performed with the aid of the mount 10 via a parallelogram 21.

If required, it is also possible further to provide various transformation ratios in order to achieve the desired isofocality of 8 the collector mirror 1.

If appropriate, it is also additionally possible to make further provision of a cooling device, which is indicated only in principle in FIG. 4 with the aid of the reference numeral "22". Since, in particular when used with laser plasma sources, collector mirrors 1 are heated nonuniformly in a fashion distributed over the circumference, the cooling ducts 22 are to be arranged such that local cooling can be carried out in such a way that, when seen overall, at least largely uniform temperature results for the collector mirror 1.

In the event of temperature increase, displacement of the collector mirror 1 also produces a variation in the magnification factor—although only to a slight extent.

What is claimed is:

1. A focusing-device for the radiation from a light source, having a collector mirror which collects light from the light source located near its first focus with a first and a second focus lying on an optical axis at the second virtual or real focus, wherein the collector mirror can be displaced in the direction of the optical axis, and is constructed and/or mounted in such a way that the position of the second focus remains unchanged in the event of temperature changes.

2. The focusing-device as claimed in claim 1, wherein the light source is a laser plasma source.

3. The focusing-device as claimed in claim 1, wherein the collector mirror can be displaced in direction of the optical axis and is constructed in such a way that in the event of temperature changes its shape can be changed in accordance with an isofocal family of curves in such a way that the spacing between the first focus and the second focus is kept constant.

4. The focusing-device as claimed in claim 1, wherein the collector mirror can be displaced in the z-direction of the optical axis and its shape can be varied in the event of temperature changes in such a way, and the light source can be displaced in such a way that at the angle distribution of the radiation remains the same at the second focus.

5. The focusing-device as claimed in claim 1, wherein the collector mirror can be displaced in the direction of the optical axis or its shape can be varied or the light source can be displaced in such a way that the angle distribution of the radiation remains the same at the second focus in case of temperature changes.

6. The focusing-device as claimed in claim 1, wherein the collector mirror is mounted to a frame in the plane of the light source.

7. The focusing-device as claimed in claim 6, wherein the displacement can be carried out by a passive change in shape of the collector mirror and the mount thereof.

8. The focusing-device as claimed in claim 6, wherein the displacement can be carried out by a passive change in shape of the collector mirror or the mount thereof.

9. The focusing-device as claimed in claim 6, wherein the collector mirror is mounted in the frame via a parallelogram beam arrangement.

10. The focusing-device as claimed in claim 6, wherein active components are provided for the displacement.

11. The focusing-device as claimed in claim 10, wherein the active components are arranged between the collector mirror and the frame.

12. The focusing-device as claimed in claim 6, wherein the collector mirror is connected to the mount via banding beams.

13. The focusing-device as claimed in claim 1, wherein the collector mirror is biased in the direction of the light source.

14. The focusing-device as claimed in claim 13, wherein a spring device is provided for the biasing.

15. The focusing-device as claimed in claim 1, wherein given an anisotropic thermal loading, the collector mirror is provided with inhomogeneously distributed cooling devices in such a way that an approximately uniform temperature distribution can be achieved in the collector mirror.

16. The focusing-device as claimed in claim 1, for the use in micro lithography using EUV-radiation.

* * * * *

UNITED STATES PATENT AND TRADEMARK OFFICE
CERTIFICATE OF CORRECTION

PATENT NO.     : 6,655,808 B2
DATED          : December 2, 2003
INVENTOR(S)    : Martin Antoni et al.

It is certified that error appears in the above-identified patent and that said Letters Patent is hereby corrected as shown below:

Column 1,
Line 31, delete "...cooling system,..." and replace it with -- ...cooling system. --
Line 60, delete "...simplification, If an..." and replace it with -- ...simplification. An... --
Line 64, delete "...remain constant . This means..." and replace it with -- ...remain constant. This means... --

Column 2,
Line 14, delete "...eccentricity Y..." and replace it with -- eccentricity γ... --

Column 3,
Line 64, delete "...this purpose, The eccentricity..." and replace it with -- ...this purpose. The eccentricity... --

Column 4,
Line 4, delete "...(1+a· dT..." and replace it with -- ...(1+a· dT)... --
Lines 10 and 11, delete "...ßo..." and replace it with -- ...ßc... --
Line 16, delete "...the source 2 displaced..." and replace it with -- ...the source 2 is displaced... --
Line 17, delete "...in this case. Instead..." and replace it with -- ...in this case. Instead... --
Line 18, delete "...possible in, principle for..." and replace it with -- ...possible in principle for..."
Line 20, delete "...the same, In practice,..." and replace it with -- ...the same. In practice... --
Line 27, delete "...which a is isofocal..." and replace it with -- ...which is isofocal... --

Signed and Sealed this

Fourteenth Day of September, 2004

JON W. DUDAS
*Director of the United States Patent and Trademark Office*